(12) United States Patent
Fujita et al.

(10) Patent No.: US 9,240,498 B2
(45) Date of Patent: Jan. 19, 2016

(54) OPTICAL SEMICONDUCTOR DEVICE (71) Applicant: SEIKO INSTRUMENTS INC., Chiba-shi, Chiba (JP)

(72) Inventors: Hiroyuki Fujita, Chiba (JP); Sadao Oku, Chiba (JP); Koji Tsukagoshi, Chiba (JP); Keiichiro Hayashi, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 0 days.

(21) Appl. No.: 14/485,901

(22) Filed: Sep. 15, 2014

(65) Prior Publication Data

US 2015/0076645 A1    Mar. 19, 2015

(30) Foreign Application Priority Data

Sep. 18, 2013 (JP) ................... 2013-192962

(51) Int. Cl.
*H01L 31/0203* (2014.01)
*H01L 31/0232* (2014.01)

(52) U.S. Cl.
CPC ... *H01L 31/0203* (2013.01); *H01L 2224/45144* (2013.01); *H01L 2224/45147* (2013.01); *H01L 2224/48091* (2013.01); *H01L 2224/48247* (2013.01)

(58) Field of Classification Search
CPC ............... H01L 31/0232; H01L 27/14618; H01L 27/14683; H01L 2924/01079
USPC ............................................ 257/433; 438/64
See application file for complete search history.

(56) References Cited

U.S. PATENT DOCUMENTS

2009/0066230 A1* 3/2009 Hirosaki et al. ............. 313/504
2009/0309116 A1* 12/2009 Kato et al. ..................... 257/98
2015/0014725 A1* 1/2015 Hong et al. .................... 257/98

OTHER PUBLICATIONS

Patent Abstracts of Japan, Publication No. 2005-191498, Publication Date Jul. 14, 2005.
Patent Abstracts of Japan, Publication No. 2011-060788, Publication Date Mar. 24, 2011.
Patent Abstracts of Japan, Publication No. 2011-065146, Publication Date Mar. 31, 2011.

* cited by examiner

*Primary Examiner* — Phuc Dang
(74) *Attorney, Agent, or Firm* — Adams & Wilks (57) ABSTRACT Phosphate-based glass doped with copper ions having infrared blocking filter characteristics is formed into particles and is mixed with a transparent encapsulating resin to encapsulate a semiconductor element. The glass particles have a particle diameter four times or more as large as a wavelength of infrared radiation to be blocked. An optical semiconductor device can be obtained having a stable filter characteristics thereof even if an incident light angle changes and is resistant to moisture.

4 Claims, 6 Drawing Sheets

OPTICAL SEMICONDUCTOR DEVICE

BACKGROUND OF THE INVENTION

1. Field of the Invention

The present invention relates to an infrared blocking optical semiconductor device.

2. Description of the Related Art

In recent years, the number of apparatus having an optical semiconductor device such as an optical sensor mounted thereon is increasing. From an ecological point of view not only small-sized portable apparatus such as a cellular phone and a smart phone but also a flat screen television, a refrigerator, an air conditioner, a lighting fixture, and the like, which are so-called home appliances, carry an optical sensor mounted thereon. Such optical sensors specifically include a proximity sensor for detecting approach of a human body, an illuminance sensor for detecting brightness of the outside to presume absence of a person in a house, and an illuminance sensor for, similarly, detecting brightness of the outside to adjust an amount of light emitted from a backlight or a lighting fixture.

The development of the home appliances such as a flat screen television faces challenges of improving the performance thereof year after year, and, in addition, increasing an energy saving rate, and many of the home appliances have the function of finely controlling illuminance. Electronic components used in such portable terminals and home appliances are, as more functionality and portability thereof are sought, required to be more miniaturized, thinner, more power saving, and reduced in cost. As a result, resin molded packages appear to be often adopted. As a background thereto, there is a trend toward commonality of components and materials. An optical semiconductor device which is one of electronic components mounted for reducing power consumption is no exception, and, similarly to other electronic components, many of optical semiconductor devices are more miniaturized, thinner, and reduced in cost using a resin molded package.

Figure 8:
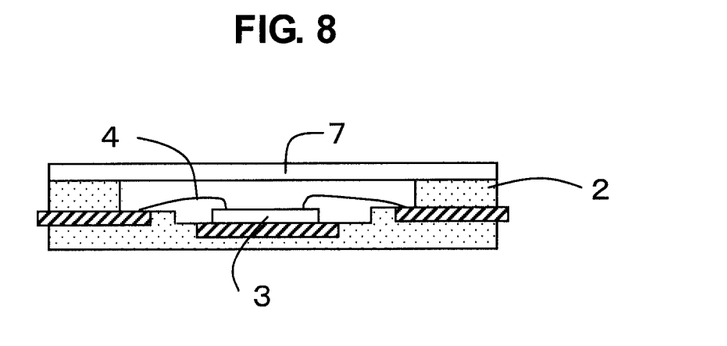
FIG. 8 is a sectional view schematically illustrating a structure of a related-art optical semiconductor device.

FIG. 8 is an exemplary disclosure of an optical semiconductor device in which an optical semiconductor element 3 is mounted on a resin molded lead frame substrate 2 (for example, FIG. 2 of Japanese Published Patent Application No. 2005-191498). In this case, the resin molded lead frame substrate is a resin molded package in which a lead frame is encapsulated in advance in a resin except for an upper surface of an element mounting portion and there is a hollow portion over a surface to be the element mounting portion. Connections are made via gold wires 4 to the optical semiconductor element 3 mounted on the bottom of the hollow portion, and a hermetic seal is made with a cover glass 7 which transmits light.

Figure 4:
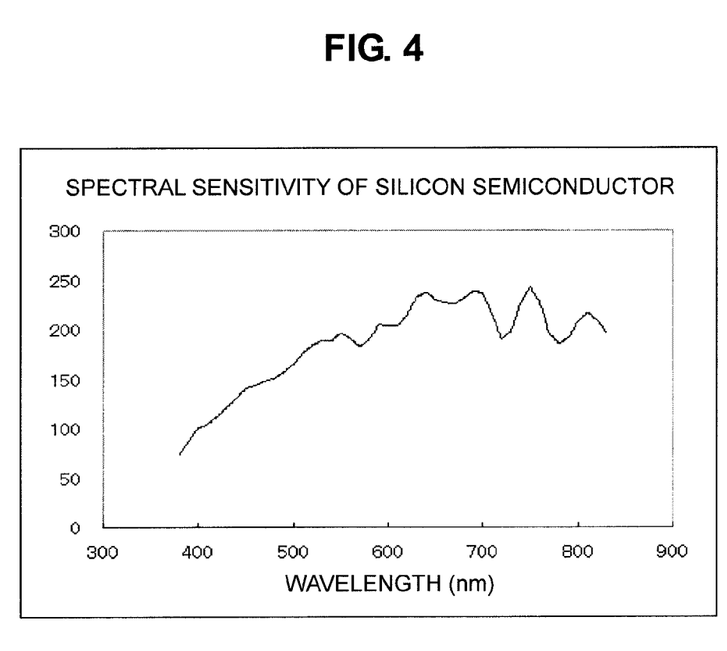
FIG. 4 shows exemplary spectral sensitivity of a silicon photodiode.
Figure 5:
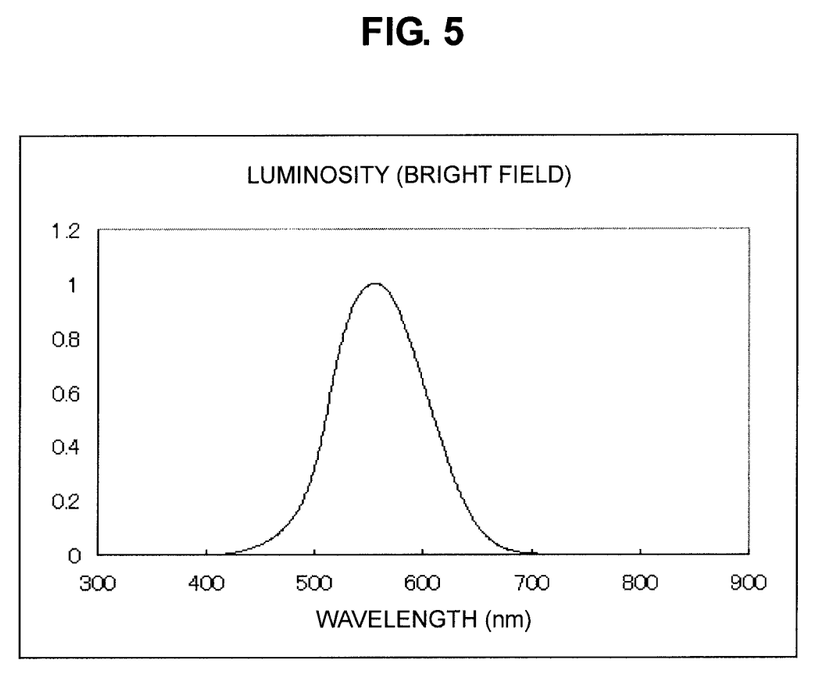
FIG. 5 shows human luminosity (bright field).
Figure 9:
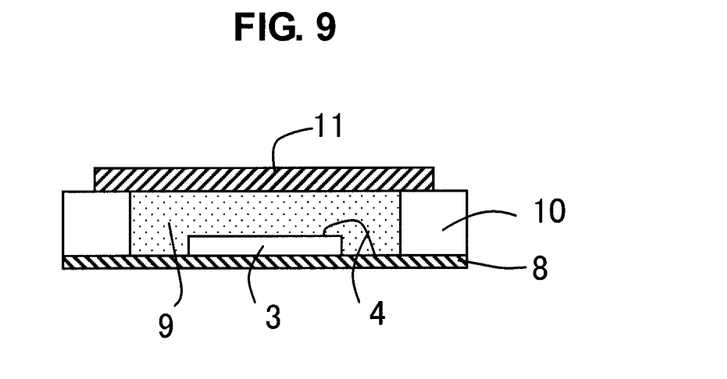
FIG. 9 is a sectional view schematically illustrating another structure of the related-art optical semiconductor device.

Depending on the application of the illuminance sensor, there are cases in which a silicon photodiode is used as the optical semiconductor element 3. A silicon photodiode has spectral sensitivity to an infrared region. FIG. 4 shows exemplary spectral sensitivity of the silicon photodiode. FIG. 5 shows human luminosity. The silicon photodiode has sensitivity over a wide infrared wavelength region, and thus, in order to conform the spectral sensitivity of the silicon photodiode to human luminosity, an infrared blocking filter is necessary. FIG. 9 illustrates an exemplary disclosed structure of an optical semiconductor device in which an infrared blocking filter 11 is placed over the silicon photodiode to conform the spectral sensitivity of the optical semiconductor device to human luminosity (for example, page 5 and FIGS. 1 and 3 of Japanese Published Patent Application No. 2011-060788).

The optical semiconductor element 3 is connected to a glass epoxy resin substrate 8 via the gold wire 4, a visible-light and infrared blocking resin 10 and a visible-light resin 9 are molded, and the infrared blocking filter 11 is placed.

Among cases in which the infrared blocking filter is formed by mixing infrared absorbing particles, there is an example in which particle diameters of particles used as the infrared blocking filter are adjusted to disclose an optimum particle diameter for use as a filter (for example, page 15 of Japanese Published Patent Application No. 2011-065146). When the particle diameter is similar to a wavelength of infrared radiation to be absorbed, the infrared radiation is scattered by Mie scattering. When the particle diameter is smaller than the wavelength of the infrared radiation, transition is made from a Mie scattering region to a Rayleigh scattering region. It is disclosed that Rayleigh scattering reduces inversely with the sixth power of an average particle diameter, and thus, the amount of scattered light is very small when the particle diameter is sufficiently small, preferably when the average particle diameter is 100 nm or less.

Figure 6:
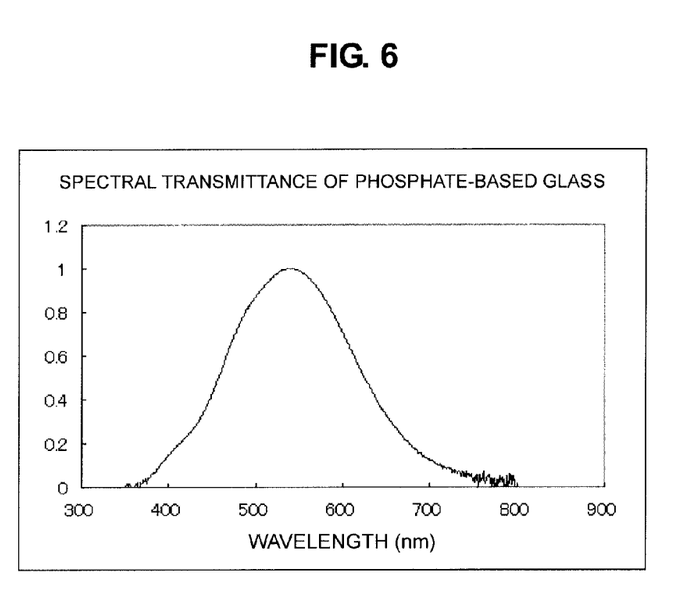
FIG. 6 shows exemplary spectral characteristics of phosphate-based glass doped with copper ions.
Figure 7:
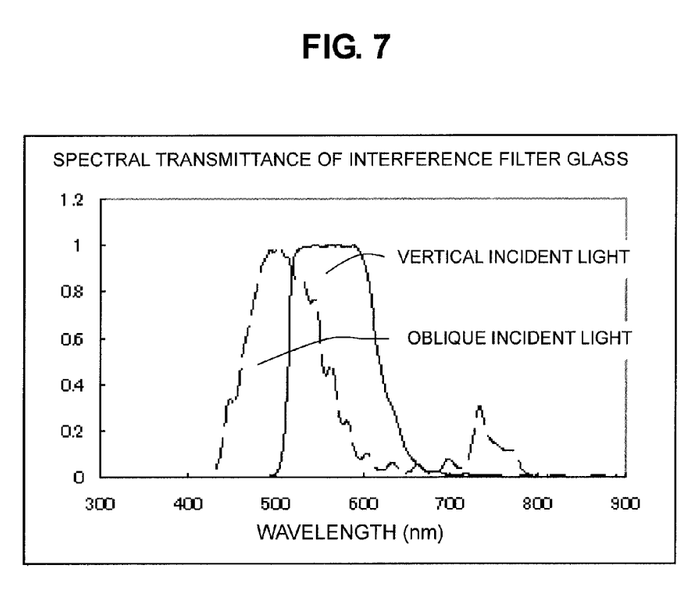
FIG. 7 shows exemplary spectral characteristics of interference filter glass.

In general, as the infrared blocking filter, phosphate-based glass doped with copper ions or interference filter glass having a multilayer film formed thereon is used. FIG. 6 shows exemplary spectral characteristics of the phosphate-based glass doped with copper ions. FIG. 7 shows spectral characteristics of the interference filter glass using a multilayer film. Phosphate-based glass doped with copper ions is an infrared blocking filter of a type which absorbs infrared radiation and has a feature in that the spectral characteristics thereof does not change even if an incident light angle changes, but there is a problem in that the infrared blocking filter is inferior in resistance to moisture. Interference filter glass is an infrared blocking filter of a type which reflects infrared radiation and has a feature of having satisfactory resistance to moisture, but there is a problem in that, when an incident light angle changes, an optical path in an interference film through which incident light passes changes, and thus, the spectral characteristics of the infrared blocking filter changes. As shown in FIG. 7, the spectral characteristics with regard to vertical incident light are similar to luminosity characteristics, but the spectral characteristics with regard to oblique incident light deviate from the luminosity characteristics, and transmitted light is observed also around 750 nm. There are cases in which an infrared blocking filter formed by mixing infrared absorbing particles uses infrared absorbing particles that are smaller than the wavelength of the infrared radiation, i.e., 100 nm or less. However, there is a problem in that, as the particle diameter becomes smaller, reduction in size of the particles becomes tremendously difficult, which requires additional costs, facilities, and time for the reduction in size.

SUMMARY OF THE INVENTION

Accordingly, an object of the present invention is to provide an infrared blocking optical semiconductor device having satisfactory resistance to moisture.

In order to solve the problem described above, the following measures are used in the present invention.

Phosphate-based glass having infrared blocking filter characteristics is formed into powder particles and is mixed with a transparent encapsulating resin for encapsulating an optical semiconductor element, and the transparent encapsulating resin is used to encapsulate the optical semiconductor element to form an optical semiconductor device with an infrared blocking filter. The transparent encapsulating resin is selected so as to have a refractive index which is the same as a refractive index of the phosphate-based glass. The phosphate-based glass particles have a particle diameter which is four times or more as large as a wavelength of infrared radiation to be blocked.

Specifically, the following structure is obtained.

First, an optical semiconductor device includes: a resin molded lead frame substrate; an optical semiconductor element mounted on the resin molded lead frame substrate; and a transparent encapsulating resin mixed with phosphate-based glass particles containing copper ions.

Further, in the optical semiconductor device, the phosphate-based glass particles containing copper ions contain particles having a particle diameter of 2.8 μm or more.

Further, in the optical semiconductor device, the phosphate-based glass particles containing copper ions contain 25% to 40% in volume fraction of particles having the particle diameter of 2.8 μm or more and less than 6.0 μm and 15% to 30% in volume fraction of particles having the particle diameter of 6.0 μm or more.

Further, the optical semiconductor device further includes a cover glass placed on an upper surface of the transparent encapsulating resin.

Further, the following manufacturing method is used.

First, a method of manufacturing an optical semiconductor device includes: die bonding an optical semiconductor element on a resin molded lead frame substrate; wire bonding the optical semiconductor element via a metal wire to the resin molded lead frame substrate; forming a phosphate-based glass block into phosphate-based glass particles; and encapsulating the optical semiconductor element in a transparent encapsulating resin mixed with the phosphate-based glass particles.

Further, in the method of manufacturing an optical semiconductor device, the forming a phosphate-based glass block into phosphate-based glass particles includes water granulating and milling.

Further, in the method of manufacturing an optical semiconductor device, the milling includes at least mixing first glass particles obtained in first milling and second glass particles obtained in second milling.

Further, in the method of manufacturing an optical semiconductor device, the first milling includes carrying out milling once and the second milling includes carrying out milling a plurality of times.

Further, in the method of manufacturing an optical semiconductor device, the milling uses any one of jet milling, ball milling, and vibration milling.

With use of the above-mentioned measures, it is possible to obtain the infrared blocking optical semiconductor device that uses phosphate-based glass and still has satisfactory resistance to moisture. According to one embodiment of the present invention, spectral characteristics of the optical semiconductor device do not change even if an incident light angle changes.

DETAILED DESCRIPTION OF THE PREFERRED EMBODIMENTS

An optical semiconductor device according to the present invention is formed by forming phosphate-based glass into particles, mixing the particles with a transparent encapsulating resin for encapsulating the optical semiconductor element, and encapsulating a silicon photodiode as the optical semiconductor element in the transparent encapsulating resin. The phosphate-based glass is doped with copper ions, and has the function of an infrared blocking filter. Phosphate-based glass which has a problem of unsatisfactory resistance to moisture can be used under a state of being covered with the transparent encapsulating resin, and thus, it is possible to obtain the optical semiconductor device configured to use phosphate-based glass as the infrared blocking filter and still having satisfactory resistance to moisture.

A silicon photodiode has spectral sensitivity in particular to a near-infrared region of an infrared region. In order to form, in combination with a silicon photodiode, an optical semiconductor device having the function of an illuminance sensor, it is necessary to block infrared radiation having wavelengths of 700 nm to 2,000 nm. The silicon photodiode does not have spectral sensitivity to infrared radiation having larger wavelengths, and thus, such infrared radiation is not required to be considered. In this case, the diameters of the phosphate-based glass particles are set to include a component which is four times or more as large as the wavelength of 700 nm of the infrared radiation to be blocked, that is, 2.8 μm or more. This is because, when the particle diameter is similar to the wavelength of the infrared radiation, due to the Mie scattering effect, the infrared radiation is scattered to leak from the transparent encapsulating resin layer to be the infrared blocking filter.

Specific optical semiconductor devices according to embodiments of the present invention are described in the following with reference to the attached drawings.

First Embodiment

Figure 1:
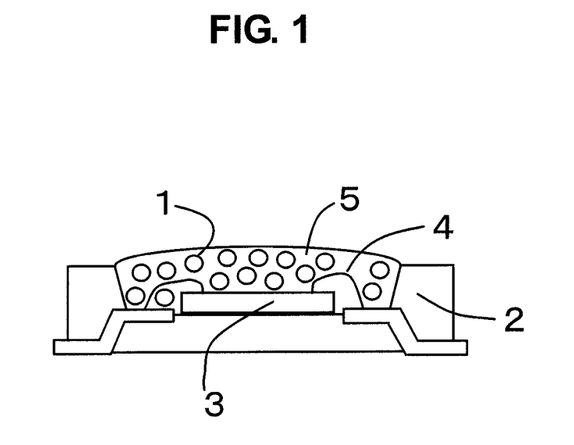
FIG. 1 is a sectional view schematically illustrating a structure of an optical semiconductor device according to the present invention.

FIG. 1 is a sectional view schematically illustrating an optical semiconductor device of this embodiment. An optical semiconductor element 3 is fixed onto a mounting surface inside a resin molded lead frame substrate 2 having a hollow portion formed therein, and is mounted by wire bonding via gold wires 4. The hollow portion is filled with a transparent encapsulating resin 5, and an upper surface and side surfaces of the optical semiconductor element 3 are encapsulated in the transparent encapsulating resin 5. Phosphate-based glass particles 1 doped with copper ions and having the function of an infrared blocking filter are mixed with the transparent encapsulating resin 5. The phosphate-based glass particles 1 themselves are hygroscopic, but are covered with the transparent encapsulating resin 5 which is resistant to moisture. Further, the transparent encapsulating resin 5 having the phosphate-based glass particles 1 doped with copper ions mixed therewith covers the upper surface and the side surfaces of the optical semiconductor element 3, and thus, the spectral transmittance with regard to oblique incident light is similar to that with regard to vertical incident light.

The infrared blocking optical semiconductor device having the above-mentioned structure can have satisfactory resistance to moisture.

Figure 2A:
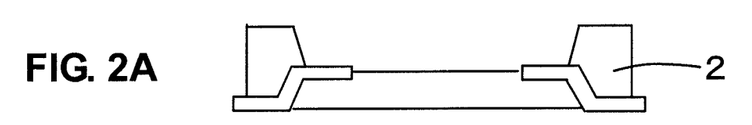
FIGS. 2A to 2E are sectional views schematically illustrating a method of manufacturing an optical semiconductor device according to the present invention.
Figure 2B:
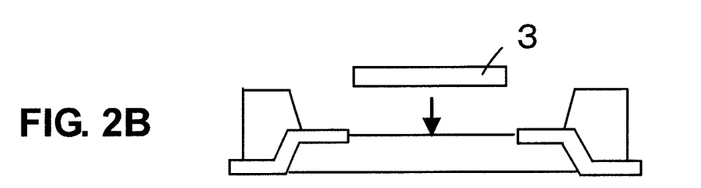
Figure 2C:
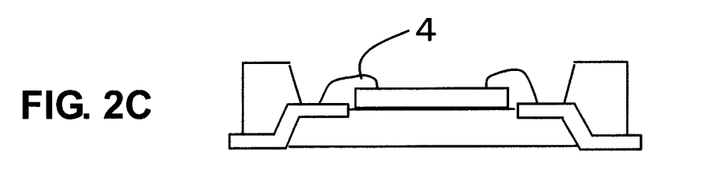
Figure 2D:
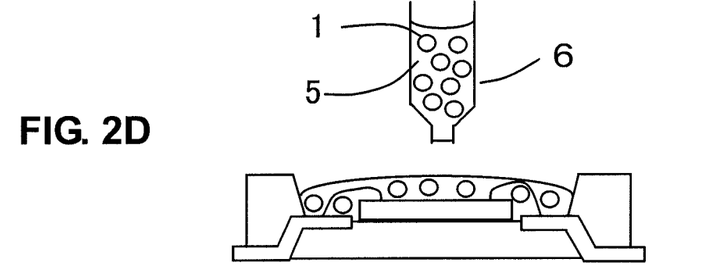
Figure 2E:
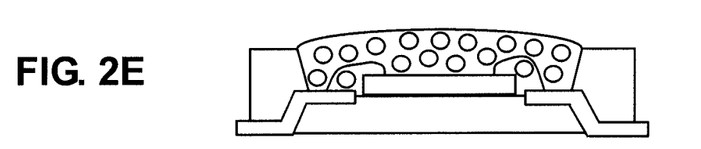

FIGS. 2A to 2E are sectional views schematically illustrating manufacturing steps of the optical semiconductor device according to the present invention. As illustrated in FIGS. 2A to 2C, the optical semiconductor element 3 is routinely die bonded to the resin molded lead frame substrate 2 using a die bonding material (not shown). The die bonded optical semiconductor element 3 is wire bonded via the gold wires 4 to inner leads of the resin molded lead frame substrate 2. Note that, there are cases in which, instead of the gold wires, aluminum wires or copper wires are used. As illustrated in FIG. 2D, a dispenser 6 is used to fill the hollow portion with the transparent encapsulating resin 5 having the phosphate-based glass particles 1 with the function of an infrared blocking filter mixed therewith. The optical semiconductor element 3 is encapsulated by the resin to give a structure as illustrated in FIG. 2E.

The phosphate-based glass particles 1 doped with copper ions used here are further described. The phosphate-based glass particles 1 are prepared from a glass block in a water granulating step and a milling step. In the milling step, for example, a jet mill, a ball mill, or a vibration mill is used. An embodiment using a jet mill is herein described. A jet mill performs milling by collision of materials formed into particles in the mill. Accordingly an impurity originated from an inner wall of the mill and the like is less liable to be mixed. A jet mill FS-4 manufactured by SEISHIN ENTERPRISE CO., LTD. is a specific example of the jet mill. The material glass block is water granulated, and after that, is further crushed in a mortar, and filtered through a 20-mesh stainless screen having an opening of 0.7 mm to be charged into the jet mill. The material is passed through the jet mill a plurality of times. In this case, products which are passed through the jet mill once, twice, and four times are sampled to obtain glass powder having median particle diameters in particle size distributions of 6 µm, 3 µm, and 2 µm, respectively.

Table 1 shows the number of times the material is passed through the jet mill, the median particle diameter in the particle size distribution, and volume fractions of particles having particle diameters of less than 2.8 µm, particles having particle diameters of 2.8 µm or more and less than 6 µm, and particles having particle diameters of 6.0 µm or more. By repeating the processing through the jet mill, a component having particle diameters of 6 µm or more reduces while a component having particle diameters of less than 2.8 µm increases.

TABLE 1

| Number of times of milling | Median particle diameter | Particle diameter of less than 2.8 µm | Particle diameter of 2.8 µm or more and less than 6.0 µm | Particle diameter of 6.0 µm or more |
| --- | --- | --- | --- | --- |
| once | 6 µm | 21% | 28% | 51% |
| twice | 3 µm | 49% | 46% | 5% |
| four times | 2 µm | 73% | 27% | 0% |

Glass powder having median particle diameters of 6 µm, 3 µm, and 2 µm obtained here is mixed with the transparent encapsulating resin in varying combinations. The silicon photodiode is encapsulated in the obtained transparent encapsulating resins, and optical characteristics thereof are evaluated. ASP-1120-A/B of Shin-Etsu Silicon® is an example of the transparent encapsulating resin 5. This silicone resin has a refractive index of 1.57, which is the same as that of phosphate-based glass. By adjusting the refractive index of the encapsulating resin to the refractive index of the phosphate-based glass, a light scattering phenomenon at an interface between the phosphate-based glass particles 1 and the transparent encapsulating resin 5 is inhibited. Table 2 shows results of evaluation of the optical characteristics when the phosphate-based glass particles are mixed with the transparent encapsulating resin in varying combinations and the silicon photodiode is encapsulated in the resin. In order to obtain optical characteristics which are equivalent to those of plate-like phosphate-based glass doped with copper ions before being formed into particles, the phosphate-based glass particles are required to have a particle diameter which is four times or more as large as the wavelength of infrared radiation to be blocked. Further, satisfactory results are obtained when a component having particle diameters of 2.8 µm or more and less than 6 µm and a component having particle diameters of 6 µm or more are in good balance. When the blocked wavelength range of infrared radiation is from 700 nm to 2,000 nm, it is thought that the infrared radiation diffracts around the glass particles due to its property as a wave, and that the infrared radiation which may be originally blocked by block-like glass cannot be blocked by the glass particles having particle diameters similar to the wavelength of the infrared radiation and passes through. Satisfactory results cannot be obtained unless not only a component having particle diameters of 2.8 µm or more and less than 6 µm is included but also a component having particle diameters of 6 µm or more is included by about 20%. Among conditions shown in Table 2, the last three mixing conditions are satisfactory.

TABLE 2

| Material to be mixed | | | Ratios of respective particle diameters | | | |
| --- | --- | --- | --- | --- | --- | --- |
| Milling once | Milling twice | Milling four times | Particle diameter of less than 2.8 µm | Particle diameter of 2.8 µm or more and less than 6.0 µm | Particle diameter of 6.0 µm or more | Evaluation |
| used | — | — | 21% | 28% | 51% | So-so |
| — | used | — | 49% | 46% | 5% | So-so |
| — | — | used | 73% | 27% | 0% | So-so |
| — | used | used | 61% | 37% | 2% | So-so |
| used | used | — | 35% | 37% | 28% | Good |
| used | — | used | 47% | 28% | 25% | Good |
| used | used | used | 48% | 34% | 18% | Good |

Second Embodiment

Figure 3:
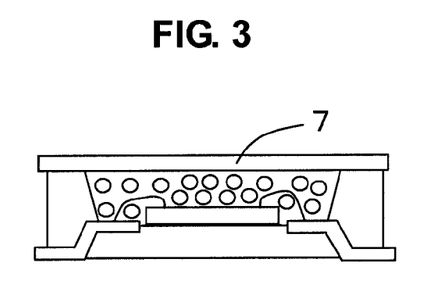
FIG. 3 is a sectional view schematically illustrating another structure of the optical semiconductor device according to the present invention.

FIG. 3 is a sectional view schematically illustrating another structure of the optical semiconductor device according to the present invention. In this case, a cover glass 7 is placed on the transparent encapsulating resin 5 suitably containing the phosphate-based glass particles described in the first embodiment. This structure eases control of a thickness of the transparent encapsulating resin 5. Further, the transparent encapsulating resin 5 is surrounded by the resin molded lead frame substrate 2 and the glass 7, and thus, reliability of the optical semiconductor device can be further improved.

When the optical semiconductor element is encapsulated in the resin, light incident on the optical semiconductor element enters and passes through the encapsulating resin layer which suitably contains the phosphate-based glass particles. In the encapsulating resin layer, light is absorbed according to the Lambert-Beer law. The absorption of light is proportional to powers of a thickness of the encapsulating resin layer. Specifically, when the thickness becomes twice as large, the square of the absorption is obtained, and, when the thickness becomes three times as large, the cube of the absorption is obtained. Therefore, variations in thickness of the encapsulating resin layer on the optical semiconductor element are directly linked to variations in sensitivity. By placing the cover glass 7 on the transparent encapsulating resin 5, variations in sensitivity of the optical semiconductor device can be reduced.

The optical semiconductor device having the infrared blocking filter which uses the phosphate-based glass doped with copper ions can be provided with high reliability, and thus, the present invention can contribute to supply to various kinds of apparatus having an optical sensor mounted thereon, including portable terminals and lighting fixtures, while considering indoor and outdoor applications and further severe environment usage.

What is claimed is:

1. An optical semiconductor device, comprising:
   a resin molded lead frame substrate having a hollow portion formed therein;
   an optical semiconductor element mounted on a mounting surface on the resin molded lead frame substrate; and
   a transparent encapsulating resin filled in the hollow portion to cover an upper surface and side surfaces of the optical semiconductor element, the transparent encapsulating resin being mixed with phosphate-based glass particles containing copper ions, wherein
   the phosphate-based glass particles containing copper ions comprise particles having a particle diameter of 2.8 µm or more, and
   the phosphate-based glass particles containing copper ions comprise 25% to 40% in volume fraction of particles having the particle diameter of 2.8 µm or more and less than 6.0 µm and 15% to 30% in volume fraction of particles having the particle diameter of 6.0 µm or more.

2. The optical semiconductor device according to claim 1, further comprising a cover glass placed on an upper surface of the transparent encapsulating resin.

3. The optical semiconductor device according to claim 1, wherein the optical semiconductor is wire bonded to inner leads of the resin molded lead frame substrate.

4. The optical semiconductor device according to claim 1, wherein the transparent encapsulating resin has a refractive index the same as that of the phosphate-based glass.

* * * * *